United States Patent
Lee et al.

(10) Patent No.: US 7,312,994 B2
(45) Date of Patent: Dec. 25, 2007

(54) HEAT DISSIPATION DEVICE WITH A HEAT PIPE

(75) Inventors: Hsieh-Kun Lee, Tu-Cheng (TW);
Chun-Chi Chen, Tu-Cheng (TW);
Shi-Wen Zhou, Shenzhen (CN); Zhan Wu, Shenzhen (CN); Bing-Wen Zhou, Shenzhen (CN); Hong-Wei Du, Shenzhen (CN)

(73) Assignees: Fu Zhun Precision Industry (Shenzhen) Co., Ltd., Bao'an District, Shenzhen, Guangdong Province (CN); Foxconn Technology Co., Ltd., Tu-Cheng, Taipei Hsien (TW)

( * ) Notice: Subject to any disclaimer, the term of this patent is extended or adjusted under 35 U.S.C. 154(b) by 89 days.

(21) Appl. No.: 11/244,688

(22) Filed: Oct. 6, 2005

(65) Prior Publication Data

US 2006/0158850 A1    Jul. 20, 2006

(30) Foreign Application Priority Data

Jan. 19, 2005  (CN)  .................. 2005 2 0054124

(51) Int. Cl.
*H05K 7/20*     (2006.01)
*F28D 15/00*   (2006.01)

(52) U.S. Cl. ............ 361/700; 361/695; 361/702; 361/704; 361/709; 165/80.4; 165/104.33; 165/185

(58) Field of Classification Search ......... 361/687, 361/694–723; 165/80.3–80.5, 104.33, 122, 165/185; 257/675, 706; 174/16.3, 15.2, 174/15.1
See application file for complete search history.

(56) References Cited

U.S. PATENT DOCUMENTS

| | | | |
|---|---|---|---|
| 3,149,666 A * | 9/1964 | Coe ........................ | 165/121 |
| 6,315,033 B1 * | 11/2001 | Li ........................ | 165/104.33 |
| 6,330,908 B1 * | 12/2001 | Lee et al. .............. | 165/185 |
| 6,439,298 B1 | 8/2002 | Li | |
| 6,538,888 B1 * | 3/2003 | Wei et al. .............. | 361/697 |
| 6,851,467 B1 * | 2/2005 | Bamford et al. ....... | 165/80.3 |
| 6,992,890 B2 * | 1/2006 | Wang et al. ............ | 361/700 |
| 7,148,452 B2 * | 12/2006 | Peterson et al. ....... | 219/443.1 |
| 2002/0170905 A1 * | 11/2002 | Peterson et al. ....... | 219/443.1 |

(Continued)

FOREIGN PATENT DOCUMENTS

CN          2546932 Y      4/2003

(Continued)

*Primary Examiner*—Jayprakash Gandhi
*Assistant Examiner*—Robert J. Hoffberg
(74) *Attorney, Agent, or Firm*—Morris Manning Martin LLP; Tim Tingkang Xia, Esq.

(57) ABSTRACT

A heat dissipation device includes a heat conducting base, a heat sink on the base and two heat pipes thermally contacting with the heat sink and the base. The heat sink is made of metal extrusion and includes a heat conducting cylinder at a periphery of the heat sink and a plurality of fins extending from and surrounded by the cylinder. The cylinder includes four interconnected sides. The fins of the same side are parallel to each other. The two heat pipes thermally surround the cylinder of the heat sink and wholly contact the heat sink.

16 Claims, 3 Drawing Sheets

U.S. PATENT DOCUMENTS

2003/0123227 A1\* 7/2003 Wang .................. 361/697
2004/0226690 A1    11/2004 Lee et al.
2006/0144572 A1\* 7/2006 Yu et al. ............. 165/104.33
2006/0273137 A1\* 12/2006 Chen et al. ............ 228/101

FOREIGN PATENT DOCUMENTS

| CN | 2599756 Y | 1/2004 |
| RU | 2263371 C1 \* | 10/2005 |
| TW | 547002 | 8/2003 |

\* cited by examiner

HEAT DISSIPATION DEVICE WITH A HEAT PIPE

BACKGROUND

1. Field

The present invention relates to a heat dissipation device for use in removing heat from electronic devices, and more particularly to a heat dissipation device incorporating a heat pipe for improving heat dissipation efficiency of the heat dissipation device.

2. Prior Art

During operation of an electronic device such as a computer central processing unit (CPU), a large amount of heat is often produced. The heat must be quickly removed from the electronic device to prevent it from becoming unstable or being damaged. Typically, a heat dissipation device is attached to an outer surface of the electronic device to absorb heat from the electronic device. The heat absorbed by the heat dissipation device is then dissipated to ambient air.

Conventionally, a heat dissipation device comprises a solid metal base attached on the electronic device, and a plurality of fins arranged on the base. The base is intimately attached on the electronic device thereby absorbing the heat generated by the electronic device. Most of the heat accumulated at the base is transferred firstly to the fins and then dissipated from the fins. However, since the electronics technology continues to advance, amount of the heat generated by the electronic devices increases enormously. Many conventional heat dissipation devices are no longer able to efficiently remove heat from these electronic devices.

In order to overcome the above disadvantages of the heat dissipation device, one type of heat dissipation device used for the electronic device includes a heat pipe which can quickly transfer heat from a position to another position of the heat dissipation device. A heat pipe is a vacuum-sealed pipe that is filled with a phase changeable fluid, usually being a liquid, such as water, alcohol, acetone and so on, and has an inner wall thereof covered with a capillary configuration. As the electronic device heats up, a hot section usually called evaporating section of the heat pipe, which is located close to the electronic device also heats up. The liquid in the evaporating section of the heat pipe evaporates and the resultant vapor reaches a cool section usually called condensing section of the heat pipe and condenses therein. Then the condensed liquid flows to the evaporating section along the capillary configuration of the heat pipe. This evaporating/condensing cycle repeats and since the heat pipe transfers heat so efficiently, the evaporating section is kept at or near the same temperature as the condensing section of the heat pipe. Correspondingly, heat-transfer capability of the heat dissipation device including such the heat pipe is improved greatly.

As disclosed in China patent No. CN 2599756Y, a heat dissipation device comprises a heat pipe thermally contacting a base for absorbing heat from a heat generating electronic device and a plurality of fins for dissipating the heat. However, due to small thickness of each fin, the heat pipe has a very limited area contacting the fins. Additionally, it is difficult to achieve intimate combination between the heat pipe and the fins. As a result, the heat exchange between the fins and the heat pipe is considerably limited. Furthermore, the fins can not be stably stacked on the heat pipe due to the same reason. TW patent No. 547002 discloses another heat dissipation device comprising a heat pipe combined to two heat sinks. The heat pipe is substantially U-shaped, and comprises two parallel portions and a middle portion connecting the two parallel portions. The two heat sinks are disposed to have fins thereof face to face and two rectangular bases thereof positioned at top and bottom sides of the fins. The two parallel portions of the heat pipe are respectively combined to the two bases of the two heat sinks. In use, heat generated by the electronic device is absorbed by the base of one heat sink contacted thereto, then delivered by the heat pipe to the fins and the base of the other heat sink to be dissipated to ambient air. However, the heat pipe only has the two parallel portions combined to the heat sinks, such that contacting area of the heat sinks and the heat pipe is still small; thus, the heat pipe is not fully utilized. So, with development of computer industry, the heat dissipation device needs further improvement to meet with high heat dissipating demand of the electronic device. In the meantime, it is preferred that the heat dissipation device has a low cost. Metal extrusion is a method for forming a heat sink with a low cost. Furthermore, it is desired that when an electric fan is used, an airflow generated by the electric fan can smoothly flow through fins of the heat sink to effectively take heat away from the heat sink.

SUMMARY

Accordingly, what is needed is a heat dissipation device which has a great heat dissipation capability and a low cost. Furthermore, a heat sink of the heat dissipation device is so configured that an airflow generated by an electric fan of the heat dissipation device can effectively take heat away from fins of the heat sink.

A heat dissipation device in accordance with a preferred embodiment of the present invention comprises a heat conducting base, a heat sink on the base and two heat pipes thermally contacting with the heat sink and the base. The heat sink comprises two heat dissipation portions combined face to face, whereby a heat conducting cylinder is formed at a periphery of the heat sink and a plurality of fins is surrounded by the cylinder. The cylinder comprises four interconnected sides. The fins extend inwardly from the sides of the cylinder. The fins subjected to the same side are parallel to each other. The two heat pipes thermally surround the cylinder of the heat sink from two opposite sides of the heat sink and wholly contact the heat sink. Free ends of the fins cooperatively define a hole through front and rear opened sides of the heat sink. An electric fan is mounted on the front sides of the heat sink. A center of the electric fan is located substantially in line with the hole of the sink.

Other advantages and novel features of the present invention will become more apparent from the following detailed description when taken in conjunction with the accompanying drawings, in which:

DETAILED DESCRIPTION OF THE EMBODIMENT

Figure 1:
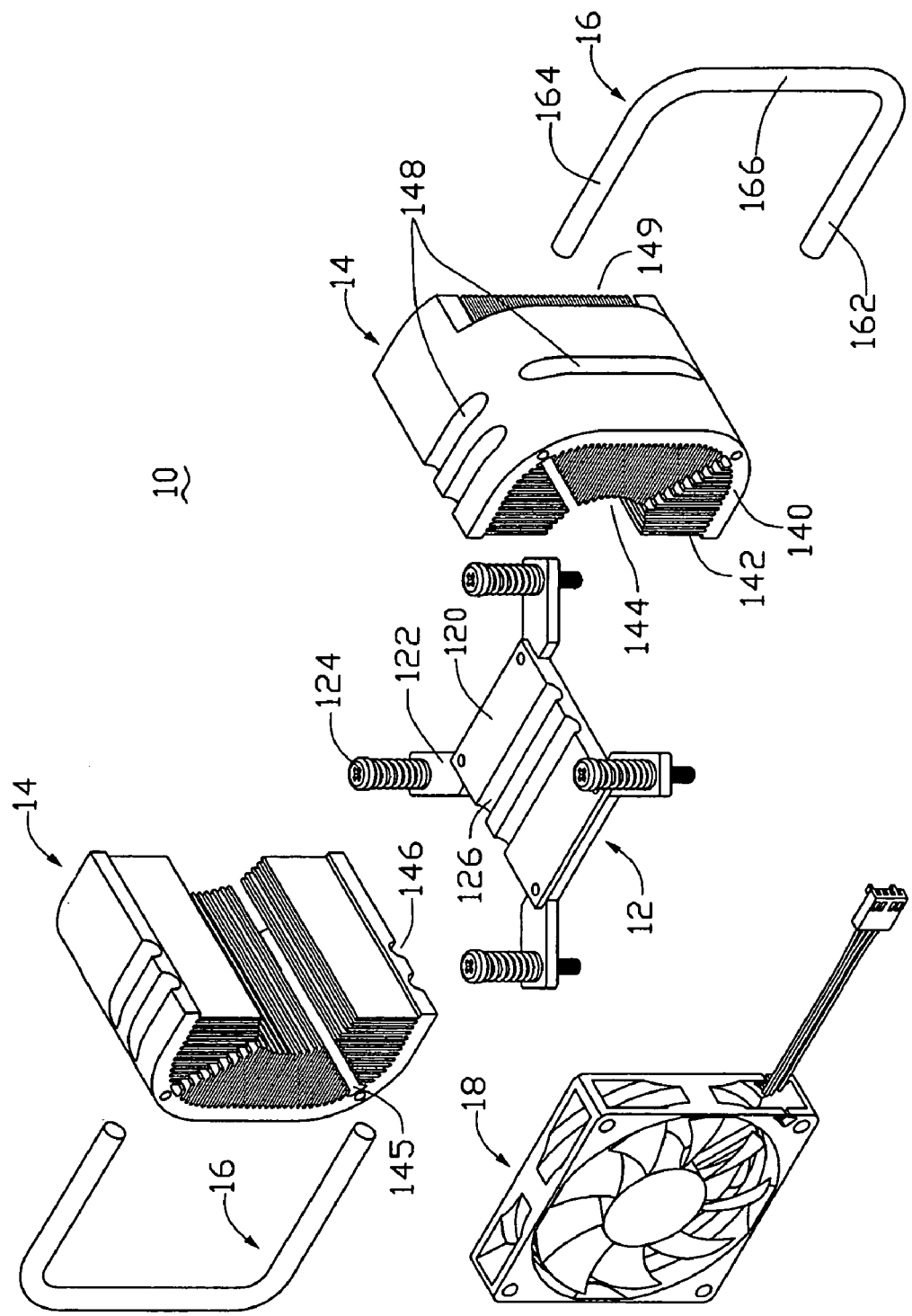
FIG. 1 is an exploded isometric view of a heat dissipation device in accordance with a preferred embodiment of the present invention.
Figure 2:
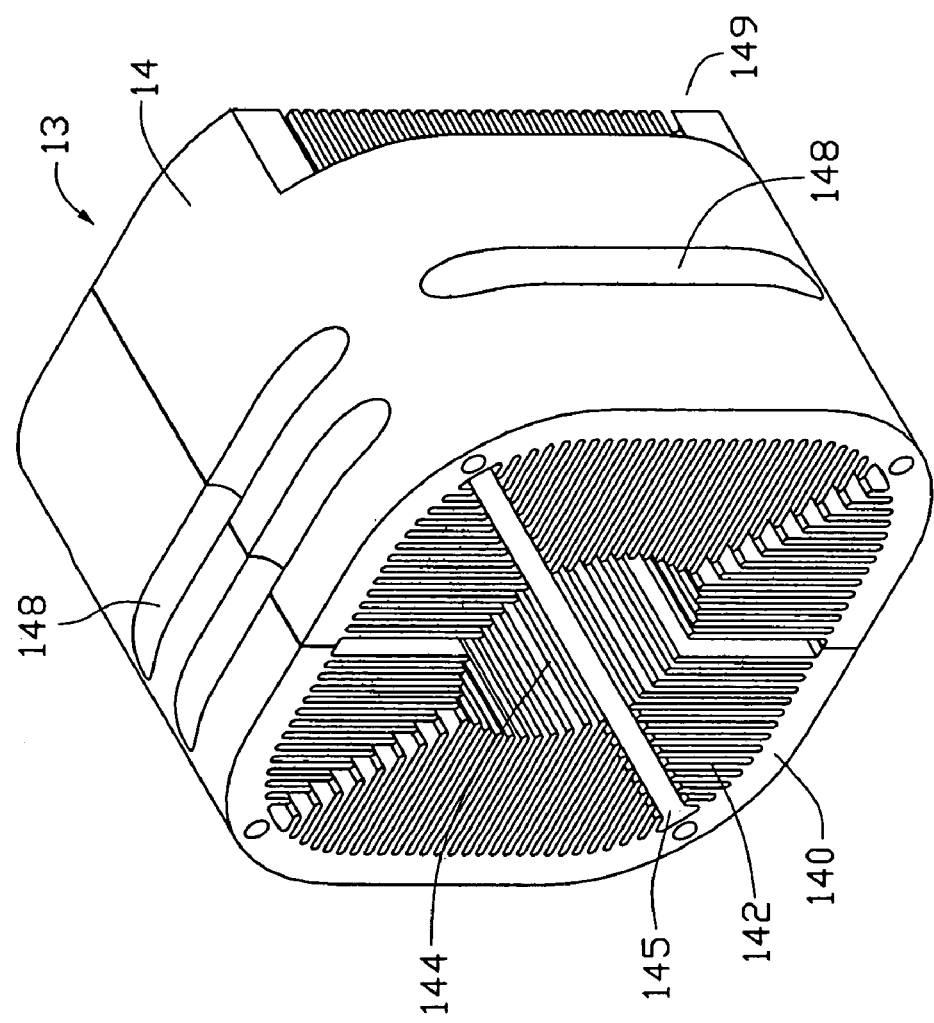
FIG. 2 shows a heat sink of FIG. 1.

Referring to FIGS. 1 and 2, a heat dissipation device 10 of a preferred embodiment of the present invention comprises a base 12, a heat sink 13 on the base 12 and two heat pipes 16 thermally contacting the base 12 and the heat sink 13.

The base 12 comprises a main body 120 and four fixing feet 122 extending from four corners of the main body 120. The main body 120 is a substantially rectangular metal plate having high thermal conductivity, and has a bottom face (not labeled) for contacting with an electronic device (not shown) located on a printed circuit board (not shown) and a top face (not labeled) opposite to the bottom face. Two parallel grooves 126, each having a semicircular cross section, are defined in the top face of the main body 120 of the base 12 for receiving the heat pipes 16 therein. Each of the fixing feet 122 has a fastener 124 positioned at a distal end thereof for fixing the heat dissipation device 10 to the printed circuit board.

The heat sink 13 has two heat dissipation portions 14 each of which is substantially U-shaped and comprises an outer wall (not labeled) and a plurality of inner fins 142 extending inwardly from the outer wall. The heat dissipation portions 14 are made of metal extrusions, for example, aluminum extrusion. In assembly, ends of the two heat dissipation portions 14 are connected together so that the outer walls form a heat conducting cylinder 140 at a periphery of the heat sink 13 and the fins 142 are surrounded by the cylinder 140. The cylinder 140 generally has top, bottom and two lateral sides. A round corner is formed at each joint of the four sides. The fins 142 extend inwardly from each of the sides and are perpendicular to the respective side. The fins 142 subjected to the same side of the four sides of the cylinder 140 are parallel to each other, and define a plurality of passages therebetween for air flowing. The fins 142 adjacent the joints of the sides of the cylinder 140 are shorter than those at middles of the sides. The fins 142 have distal ends thereof cooperatively defining a hole 144 in a center of the heat sink 13, for air flowing therethrough. Four passages 145 communicating with the hole 144 are defined between the fins 142 and extend from the hole 144 to the four joints of the sides of the cylinder 140, respectively. Two parallel grooves 146 corresponding to the grooves 126 of the main body 120 of the base 12 are defined in the bottom side of the cylinder 140. The grooves 146 and the grooves 126 cooperate to define passages for receiving the heat pipes 16 therein. Two parallel grooves 148 are defined in the top side of the cylinder 140 and are also for receiving the heat pipes 16 therein. A groove 148 is defined in each of the two lateral sides. It is apparent that the grooves 148 in the two lateral sides of the cylinder 140 are offset to each other, such that the two heat pipes 16 can be combined to the heat sink 13 in the grooves 146, 148. The two side lateral sides of the cylinder 140 respectively define two cutouts 149 at a rear side of the cylinder 140, and the fins 142 are exposed to ambient air through the cutouts 149 of the cylinder 140.

Each of the two heat pipe 16 is U-shaped and comprises a first section 162, a second section 164 parallel to the first section 162, and a middle section 166 interconnecting the first section 162 and the second section 164. A round corner is formed at each joint of the sections of the heat pipe 16.

Figure 3:
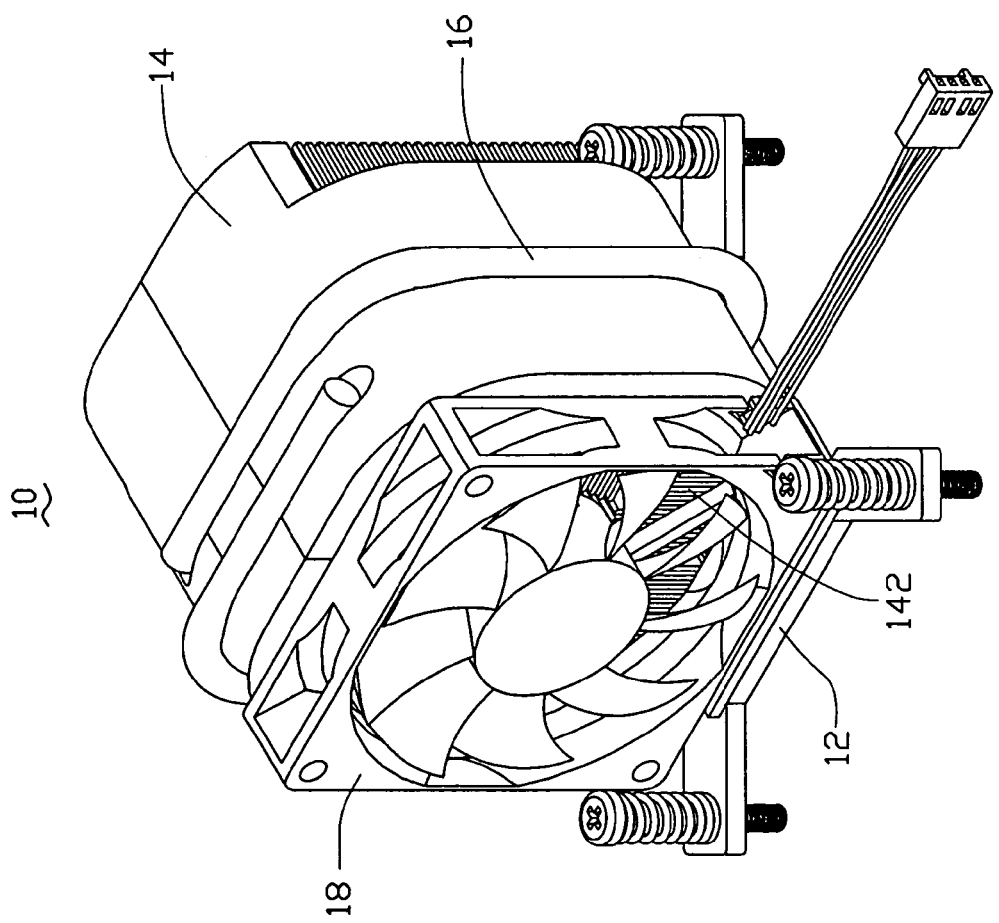
FIG. 3 is an assembled view of FIG. 1.

Referring also to FIG. 3, in assembly, the two heat pipes 16 are combined to the heat sink 13 from two opposite sides of the heat sink 13. Wherein, the first sections 162 of the heat pipes 16 are received in the grooves 126 of the base 12 and the grooves 146 of the heat sink 13, and thermally contact the base 12 and the bottom wall of the heat sink 13. The second sections 164 of the heat pipes 16 are received in the grooves 148 of the top wall of the heat sink 13 and thermally contact the top wall of the heat sink 13. The middle sections 166 of the heat pipes 16 are received in the grooves 148 of the lateral side walls of the heat sink 13 and thermally contact the lateral side walls of the heat sink 13. Therefore, the two heat pipes 16, each thermally contacting three sides of the cylinder 140, embrace the heat sink 13 therein.

The heat dissipation device 10 further comprises a fan 18 located at a front side of the heat sink 13 for providing a forced airflow to the heat sink 13. The front and rear sides of the heat sink 13 are opened to ambient air. A center of the fan 18, which provides low air pressure, confronts the hole 144 of the heat sink 13. Blades at a periphery of the center of the fan 18, which provide high air pressure, confront the fins 142 of the heat sink 13. Therefore, the airflow provided by the fan 18 can smoothly flow through the fins 142 of the heat sink 13 and have a full heat exchange with the fins 142.

In use, the base 12 of the heat dissipation device 10 is attached to the electronic device. The heat generated by the electronic device is absorbed by the base 12, and then transferred to the first sections 162 of the heat pipes 16 and the bottom wall of the heat sink 13. The heat in the first sections 162 of the heat pipes 16 is also delivered to the bottom, lateral side, and top walls of the heat sink 13 via the first sections 162, the middle sections 166 and the second sections 164 of the heat pipes 16, and then the heat reaches the fins 142 to be dissipated to ambient air under the action of the fan 18.

According to the preferred embodiment of the present invention, each of the heat pipes 16 embraces the heat sink 13 and has all sections thereof thermally contacting the heat sink 13; thus, the heat pipe 16 is fully utilized. Therefore, the heat generated by the electronic device can be rapidly delivered to the heat sink 13 and evenly spread in heat sink 13 by the heat pipes 16. Thus, heat dissipation capacity of the heat dissipation device 10 is improved.

Additionally, it can be understood that since the heat sink 13 of the heat dissipation device 10 has the cylinder 140 at the periphery thereof and the fins 142 are surrounded by the cylinder 140, the forced airflow of the fan 18 can be fully utilized. The forced airflow is confined to flow from the opened front side to the opened rear side of the heat sink 13 through the fins 142. The fins 142 subjected to the same wall of the heat sink 13 are parallel to each other, so that each of the passages between the fins 142 has a width thereof invariable, which favors airflow of the fan 18 to flow therethrough.

Although in the preferred embodiment, the heat sink 13 of the heat dissipation device 10 consists of two heat dissipation portions 14, it is well known by those skilled in the art that the heat sink 13 can be formed integrally. Additionally, the fins 142 of the heat sink 13 can extend from the walls of the heat sink 13 in a manner that they are not parallel to each other. Also, the fins 142 of the heat sink 13 can extend from the walls of the heat sink 13 in a manner that they are all parallel to each other.

It is believed that the present invention and its advantages will be understood from the foregoing description, and it will be apparent that various changes may be made thereto without departing from the spirit and scope of the invention or sacrificing all of its material advantages, the examples hereinbefore described merely being preferred or exemplary embodiments of the invention.

We claim:

1. A heat dissipation device comprising:
   a heat conducting base;
   a heat sink on the heat conducting base, the heat sink comprising a plurality of walls interconnected to form a heat conducting cylinder at a periphery thereof and a plurality of fins in the cylinder, the fins extending from the walls, the fins subjected to the same wall paralleling to each other;

a heat pipe thermally surrounding the cylinder of the heat sink and thermally contacting the heat conducting base, wherein the heat pipe is U-shaped and comprises a first section, a second section parallel to the first section and a middle section connecting the first section and the second section, the first, second and middle sections of the heat pipe all thermally contacting the heat sink; and a second heat pipe, wherein the second heat pipe is U-shaped and comprises a first section, a second section parallel to the first section and a middle section connecting the first section and the second section;

wherein two side walls of the walls of the heat sink define two grooves therein, respectively, the two grooves being offset to each other, the middle sections of the heat pipes being received in the two grooves, respectively.

2. The heat dissipation device of claim 1, wherein the heat sink has opened front and rear sides.

3. The heat dissipation device of claim 2, wherein the fins have distal ends thereof cooperatively defining a hole communicating with the opened front and rear sides of the heat sink, the hole being located at a center of the cylinder of the heat sink.

4. The heat dissipation device of claim 3, wherein a passage is defined between the fins and communicates with the hole.

5. The heat dissipation device of claim 1, wherein the fins adjacent joints of the walls of the heat sink are shorter than the fins at middles of the walls.

6. The heat dissipation device of claim 1, wherein bottom and top walls of the walls of the heat sink each defines two parallel grooves therein, and the first and second sections of the heat pipes are thermally received in the grooves, respectively.

7. The heat dissipation device of claim 1, wherein the heat conducting base defines two parallel grooves therein, the first sections of the heat pipes being received in the grooves.

8. The heat dissipation device of claim 1, wherein a side wall of the walls of the heat sink has a cutout defined therein, the fins of the heat sink being exposed to ambient air through the cutout.

9. A heat dissipation device comprising:
a heat sink comprising two heat dissipation portions combined together, whereby a heat conducting cylinder is formed at a periphery of heat sink and a plurality of fins are surrounded by the cylinder, the cylinder having a plurality of walls, the fins extending from the walls, the fins subjected to the same wall paralleling to each other; and two heat pipes thermally surrounding the cylinder of the heat sink;

wherein one of the walls of the heat sink defines a cutout therein, the fins being exposed to ambient air through the cutout.

10. The heat dissipation device of claim 9, wherein each of the two heat dissipation portions is U-shaped, and the cylinder of the heat sink is rectangular.

11. The heat dissipation device of claim 10, wherein the heat sink has opened front and rear sides, and wherein the fins of the heat sink have distal ends thereof cooperatively defining a hole communicating with the opened front and rear sides, the cylindrical hole being located at a center of the heat sink.

12. The heat dissipation device of claim 11 farther comprising a fan located at the front side of the heat sink with a center of the fan confronting the hole of the heat sink.

13. The heat dissipation device of claim 12, wherein the walls of the cylinder of the heat sink defines a plurality of grooves therein, and wherein the two heat pipes each of which is U-shaped are thermally combined to the grooves from two opposite sides of the heat sink and contact the heat sink.

14. The heat dissipation device of claim 9 further comprising a base, wherein the base thermally contacts with the two heat pipes.

15. A heat dissipation device comprising:
a heat sink made of metal extrusion, having a cylindrical outer wall with a bottom side adapted for thermally contacting with a heat-generating electronic device, a plurality of fins extending from the cylindrical outer wall inwardly towards a center of the heat sink, free ends of the fins cooperatively defining a hole through front and rear sides of the heat sink, the cylindrical outer wall defining a cutout therein, the fins being exposed to ambient air through the cutout; and a heat pipe having a first section thermally contacting the bottom side of the cylindrical outer wall, and a second section extending from the first section to thermally engage a portion of the cylindrical outer wall other than the bottom side thereof.

16. The heat dissipation device of claim 15 further comprising a fan mounted on one of the front and rear sides of the heat sink for generating an airflow through the fins, wherein the heat pipe has a third section interconnecting the first and second sections, the third section also thermally engaging with the cylindrical outer wall of the heat sink.

* * * * *